United States Patent [19]

Hagino et al.

[11] Patent Number: 4,983,576
[45] Date of Patent: Jan. 8, 1991

[54] SUPERCONDUCTING COMPOSITE WIRE AND CABLE, PROCESSOR FOR FABRICATING THEM

[75] Inventors: Sadaaki Hagino, Urawa; Motokazu Suzuki, Omiya; Shigeru Nishikawa, Omiya; Kenichi Hayashi, Omiya, all of Japan

[73] Assignee: Mitsubishi Kinzoku Kabushiki Kaisha, Tokyo, Japan

[21] Appl. No.: 408,502

[22] PCT Filed: Dec. 24, 1988

[86] PCT No.: PCT/JP88/01329
§ 371 Date: Aug. 24, 1989
§ 102(e) Date: Aug. 24, 1989

[87] PCT Pub. No.: WO89/06040
PCT Pub. Date: Jun. 29, 1989

[30] Foreign Application Priority Data

Dec. 24, 1987 [JP] Japan .................. 62-327747
Dec. 24, 1987 [JP] Japan .................. 62-327748

[51] Int. Cl.$^5$ .......... C04B 35/00; H01B 13/00; H01B 12/04; B28B 1/00
[52] U.S. Cl. ..................... 505/1; 29/599; 428/607; 428/632; 428/633; 505/704; 505/740
[58] Field of Search .......... 505/1, 704, 740; 428/607, 632, 633; 29/599

[56] References Cited

FOREIGN PATENT DOCUMENTS 0302775 2/1989 European Pat. Off. .
63-292527 11/1988 Japan .................. 505/740
63-307622 12/1988 Japan .................. 505/740
63-310518 12/1988 Japan .................. 505/740

OTHER PUBLICATIONS

Physical Review Letters, vol. 58, No. 9, Mar. 2, 1987—M.K. Wu and Eight Others, "Superconductivity at 93K in a New Mixed-Phase Y-Ba-Cu-O Compound System at Ambient Pressure", p. 908-P. 910.

Primary Examiner—John P. Sheehan
Assistant Examiner—David Schumaker
Attorney, Agent, or Firm—Cushman, Darby & Cushman

[57] ABSTRACT

A superconducting structural body comprising
a superconducting ceramics and
a metal sheath surrounding the superconducting ceramics,
the metal sheath including
  an Ag portion and
  a non-Ag metal portion, the Ag portion existing from inner to outer faces of the metal sheath, and the superconducting ceramics portion existing in the structural body and the non-Ag metal portion used as a structural material for the metal sheath as the outermost indirectly contacting each other through the Ag material.

4 Claims, 4 Drawing Sheets

SUPERCONDUCTING COMPOSITE WIRE AND CABLE, PROCESSOR FOR FABRICATING THEM

TECHNICAL FIELD

This invention relates to a superconducting composite wire which comprises a metal sheath filled with a compound having a perovskite structure, the compound comprising a Y-including rare earth element (hereinafter indicated by a symbol R), an alkaline earth metal (hereinafter indicated by a symbol A), copper (Cu) and oxygen (O) (hereinafter, the compound being referred to as a superconducting ceramics), to a superconducting composite cable which comprises a plurality of such superconducting wires bundled to each other, and to a process for fabricating them.

BACKGROUND ART

Generally, processes for fabricating wires using the superconducting ceramics include the following steps:

(a) a step of providing starting powders, i.e., an $R_2O_3$ powder, an alkaline earth metal carbonate powder as the component A, and CuO powder, each having an average grain size of not greater than 10 $\mu$m, compounding and mixing them in a predetermined compounding ratio, to obtain a mixed powder, calcining the mixed powder in the air or in an oxygenic atmosphere, at a temperature of from 850° to 950° C. to form superconducting ceramics having a perovskite structure, and grinding the ceramics to obtain powder of an average grain size of not greater than 10 $\mu$m, (b) a step of filling a pipe of silver (Ag) with the superconducting powder ground in the previous step, sealing the both ends of the pipe under vacuum, and subjecting the silver pipe filled with the ground powder to drawing operations, e.g., swaging, rolling with grooved rolls, processing with a die, or the like, to produce a wire having a diameter of not greater than 5 mm as shown in FIG. 1, (c) a final step of sintering the superconducting ceramics powder filled in the wire and then subjecting the filled Ag pipe to heat-treatment in the air or in an oxygenic atmosphere so that the ceramics can absorb oxygen enough to be required, at a temperature of from 900° to 950° C. to produce a final product.

Subsequent to the above-described steps (a) and (b) have been performed the following step:

(c') a step of bundling a plurality of the superconducting wires as shown in FIG. 1 and then covering the bundle with a tube made of Ag to form a cable, subjecting the cable to a processing with a die, if required, and to a heat-treatment in the air or in an oxygenic atmosphere, at a temperature of from 900° to 950° C. for sintering the superconducting ceramics powder to produce a superconducting cable.

In the above described conventional step (c) or (c'), the superconducting ceramic powder is heat-treated to sinter it and to enable it to absorb oxygen. In this case, because the temperature of the heat-treatment is in the range of 900° to 950° C., which is close to the melting point of Ag, the strength of Ag decreases, and the Ag wires filled with the superconducting powders or the superconducting cables become softened and tend to be easily bent or generate discontinuity or cut-off in the superconducting ceramics by careless bending. As a result, the conventional superconducting wires and cables are difficult to handle, and they break sometimes down during heat-treatment.

Accordingly, one might consider the possibility of using, as covering materials for the above described superconducting ceramics or wires, metals other than Ag (hereinafter, referred to as non-Ag metals), i.e., materials having excellent strength at high temperatures, including, for example, nickel alloys such as Inconel and Hastelloy, stainless steel, or the like. However, the non-Ag metals are disadvantageous because they cannot perform dispersion, penetration and discharge of oxygen. Specifically, in the superconducting wires and cables having sheath made of non-Ag metals, bulges are formed in the wires or cables because of oxygen released from the superconducting ceramics filled in the sheath. In the case of the wires, oxygen cannot be supplied to the superconducting ceramics when the superconducting ceramics filled in the wires are subjected to the final heat-treatment performed in the air or in an oxygenic atmosphere to sinter the superconducting ceramics. In the case of the cables, when temperature of the cables is decreased after the sintering of the superconducting ceramics, the ceramics cannot absorb oxygen.

Up to now, the metals other than Ag are practically unsuitable as covering materials for the superconducting ceramics or the outermost covering materials for the superconducting cables.

However, Ag has various problems in that it is very expensive, difficult to handle during high temperature heat-treatment, and has poor strength at high temperatures. In particular, the strength of the cables at room temperature is unsatisfactory.

DISCLOSURE OF INVENTION

Accordingly, the present inventors have intensively investigated, and as a result they have found that the above-described problems can be solved by adopting a structure in which a pipe or tube, which is used as the outermost layer for forming the superconducting structural body, i.e., the superconducting wires or cables, includes an Ag portion and a non-Ag metal portion, the Ag portion exists throughout from the inner face to the outer face of the pipe or the tube, and the superconducting ceramics portion disposed in the superconducting structural body and the non-Ag metal portion used as the material for the outermost layer indirectly contact each other through the Ag materials.

More specifically, in the case of the superconducting wires, it has been found that when a composite pipe which is made of a material having excellent mechanical strength at high temperatures and which has the Ag portion included from the inner to the outer faces of the wall thereof, with an inner layer of Ag formed at the inner face thereof, is filled with the superconducting ceramics and then the obtained composite pipe is subjected to drawing, oxygen released from the superconducting ceramics during the drawing can be diffused or discharged through the Ag portion to the ambient, so that a bulge is hardly formed in the wire. Also, it has been found that even when the composite wire produced by drawing is subjected to heat-treatment in the air or in an oxygenic atmosphere, the mechanical strength of the wire is retained by the non-Ag metal portion and oxygen is supplied to the superconducting ceramics via the Ag portion, resulting in that the deficiency of the mechanical strength of the wire occurring during the heat-treatment can be resolved.

In the case of the superconducting cable, it has been found that when a composite tube is provided which includes an Ag portion and a non-Ag portion, with the Ag portion existing from the inner to outer faces thereof, and a superconducting composite cable is produced by covering a plurality of the superconducting wires with the composite tube, the resulting composite tube has excellent mechanical strength at high temperatures or room temperature, no bulge is formed in the composite cable because oxygen released from the superconducting ceramics is diffused through the Ag portion and discharged to the ambient, and furthermore after the superconducting ceramics filled in the cable is sintered, oxygen can diffuse through the Ag portion of the composite tube into the superconducting ceramics and absorbed thereby.

This invention has been made on the basis of the above-described discoveries.

Accordingly, it is a first object of this invention to provide a superconducting structural body comprising a superconducting ceramics and a metal sheath surrounding the ceramics, the metal sheath including an Ag portion and a non-Ag metal portion, the Ag portion existing from the inner to outer faces of the sheath, and the superconducting ceramics portion in the structure and the non-Ag portion used as a structural material for the metal sheath as the outermost layer being indirectly contacted each other through the Ag portion.

It is a second object of this invention to provide a superconducting wire comprising a composite pipe having an inner layer made of Ag material and an outer layer including an Ag portion and a non-Ag portion, the Ag portion of the outer layer being solid with the Ag material of the inner layer and exposed on the outer surface of the composite pipe, and a superconducting ceramics filled in the composite pipe.

It is a third object of this invention to provide a superconducting composite cable comprising a plurality of Ag-sheathed superconducting wires each being filled with superconducting ceramics, and a composite tube including an Ag portion and a non-Ag metal portion, the Ag portion existing from the inner to outer faces thereof, the superconducting wires being covered with the composite tube.

It is a fourth object of this invention to provide a process for fabricating a superconducting composite wire comprising the steps of:

filling a composite tube with a superconducting ceramics, the composite tube including an inner layer made of Ag material and an outer layer including an Ag portion and a non-Ag portion, the Ag portion of the outer layer solid with the Ag material of the inner layer and exposed on the outer surface of the composite tube, sealing the both ends of the composite tube filled with the superconducting ceramics under vacuum, drawing the sealed composite tube, and heating the sealed composite tube drawn by the previous step.

BEST MODE FOR CARRYING OUT THE INVENTION

Figure 1:
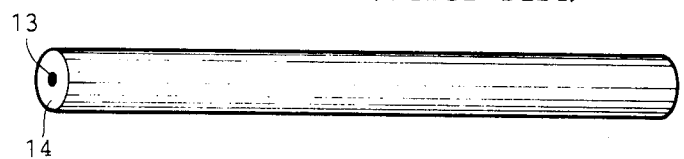
FIG. 1 shows a schematical perspective view, with portions broken away for clarity, of the conventional Ag-sheathed superconducting wire.

In the present invention, not only Y-including rare earth elements based superconducting ceramics oxide but also Bi-based superconducting ceramics oxide such as $BiSrCaCu_2O_y$, $Bi_2Sr_2Ca_2Cu_3O_y$, $(Bi,Pb)SrCaCuO_{1.5-2}$, Tl-based superconducting ceramics oxide such as $Tl_2Ba_2Ca_2Cu_3O_x$, $Tl(Ba,Sr)_2CaCuO$, can be used as superconducting ceramics, as far as the superconducting ceramics has a perovskite structure and can easily release oxygen.

In the present invention, there can be used, as a material for the Ag portion, not only pure Ag but also Ag-based alloys which contain one or more metals such as platinum (Pt) that do not react with the superconducting ceramics and give a good influence upon the strength of the superconducting wires in amounts not preventing oxygen permeation.

Hereinafter, characteristics and advantages of this invention will be explained in greater detail, with reference to the best modes of this invention illustrated in the attached drawings.

FIGS. 2 through 5 substantially illustrate the structure of the superconducting composite wire. In FIGS. 2 through 5, reference numeral 1 denotes a portion of a metal other than Ag (non-Ag metal portion) having high mechanical strength at high temperatures. The non-Ag metal portion is preferably made of Austenite-based stainless steels, Ni-alloys such as Inconel, Hastelloy, or the like. In the superconducting composite wires according to the present invention, the reason why the inner layer is made of Ag materials is that when the superconducting ceramics is subjected to heat-treatment while contacting with the non-Ag metal materials such as Austenite-based stainless steel and the like, a chemical reaction takes place to generate oxides such as NiO, FeO, $Fe_2O_3$, $Cr_2O_3$ or the like, resulting in the deterioration of the superconductive characteristics to a greater extent. Reference numeral 2 denotes an Ag portion in which the inner layer and a part of the outer layer of the composite wire are made of Ag. The Ag portion 2 in the outer layer is solid with the Ag of the inner layer 4, and is exposed on the outer surface of the composite wire. The superconducting composite wire is comprised by such composite pipe as described above and the superconducting ceramics 3 filled therein. As shown in FIGS. 2 through 5, the Ag portions are exposed on a portion of the outer layer of the wire. Accordingly, when the Ag portions are subjected to heat-treatment for sintering the superconducting ceramics, oxygen is supplied by diffusion through the Ag portions in the outer layer to the inside of the wire. Thus, oxygen is supplied to the superconducting ceramics.

Figure 2:
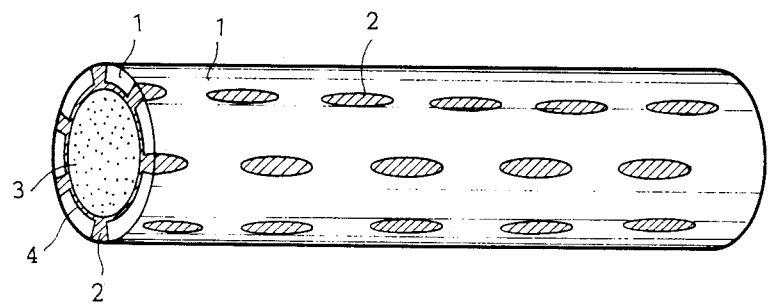
FIGS. 2 through 5 show schematical perspective views, with portions broken away for clarity, of superconducting composite wires according to the present invention, respectively.
Figure 3:
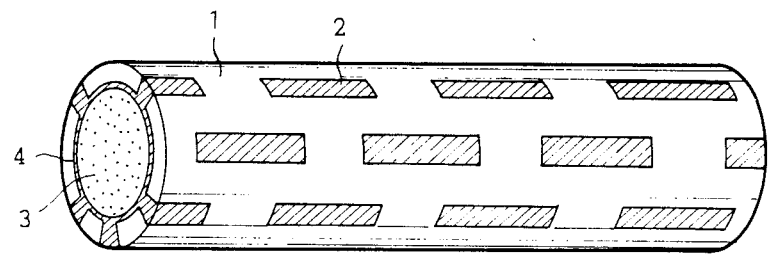
Figure 4:
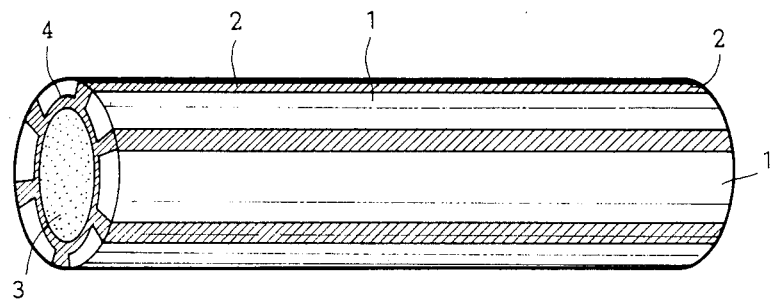
Figure 5:
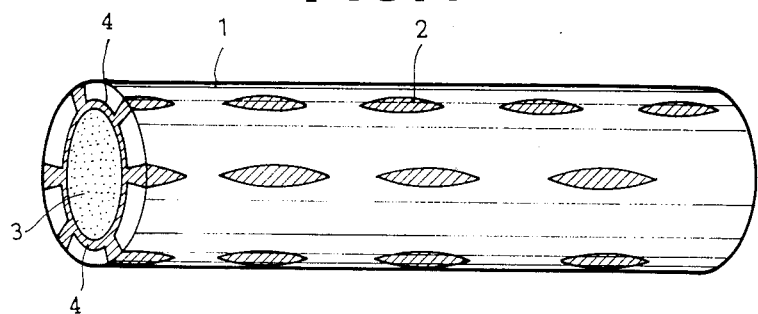

The Ag portions in the outer layer may have an oval-shaped as shown in FIG. 2, a rectangular-shaped as shown in FIG. 3, a paralleled belt-shaped as shown in FIG. 4, and a crack-shaped as shown in FIG. 5. However, the shape of the Ag portion 2 is not restricted to the above-described ones, and may take any desired shape. Although each of the composite wires has a circular cross section, the cross section is not restricted to the circular shape and may take any desired shape such as a polygonal-shape including a square-shape, a rectangular-shape, a hexagonal-shape, an oval-shape, or the like.

FIGS. 6 through 10 each shows a schematical partial sectional view, with portions broken away for clarity, of the above described superconducting composite cables. In FIGS. 6 through 10, reference numeral 11 denotes a non-Ag metal portion, 12 denotes an Ag portion, 13 denotes superconducting ceramics, and 14 denotes Ag. For comparison, a schematical partial sectional view, with portions broken away for clarity, of a superconducting wire including superconducting ceramics 13 and Ag 14 shown in FIG. 1.

It is preferred that the above described materials for the non-Ag metal portions 11 be, as in the superconducting composite wire, Austenite based stainless steels such as SUS304 or the like, Ni-alloys such as Inconel, Hastelloy, and the like, respectively. The above-described Ag portions 12 are present from the inner to the outer faces of the composite tube, and serve to diffuse oxygen released from the superconducting ceramics 13 to the ambient, and also supply oxygen to the ceramics 13 from the ambient. Accordingly, because parts of the composite tube is made of the Ag portion 12, a bulge is not formed in the composite tube since oxygen is released from the superconducting ceramics 13 through the Ag portion 12. Also, oxygen from the ambient can be passed through the Ag portion 12 in the composite tube to thereby supply oxygen to the superconducting ceramics 13.

Figure 6:
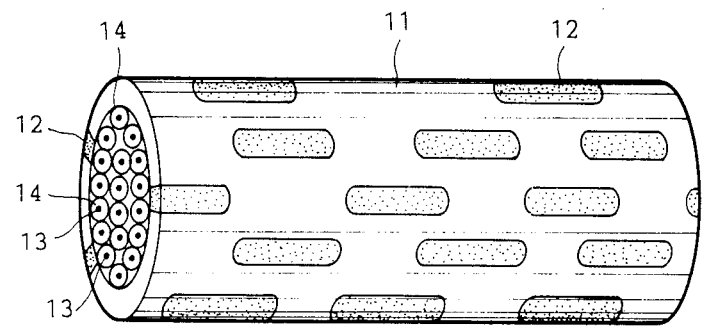
FIGS. 6 through 10 show schematical perspective views, with portions broken away for clarity, of superconducting composite cables according to the present invention, respectively.
Figure 7:
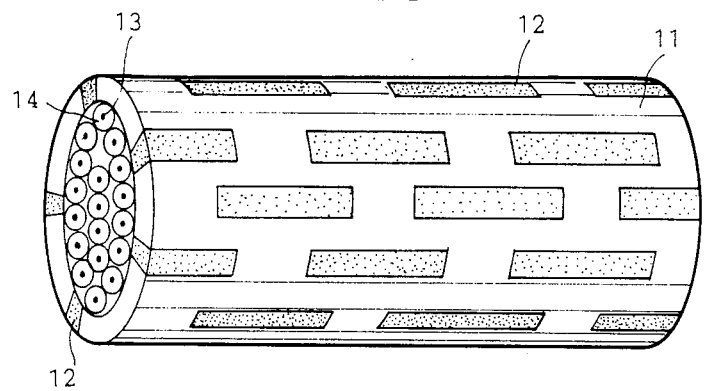
Figure 8:
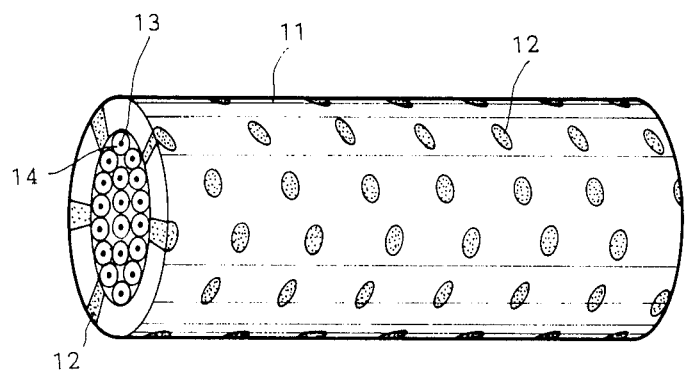
Figure 9:
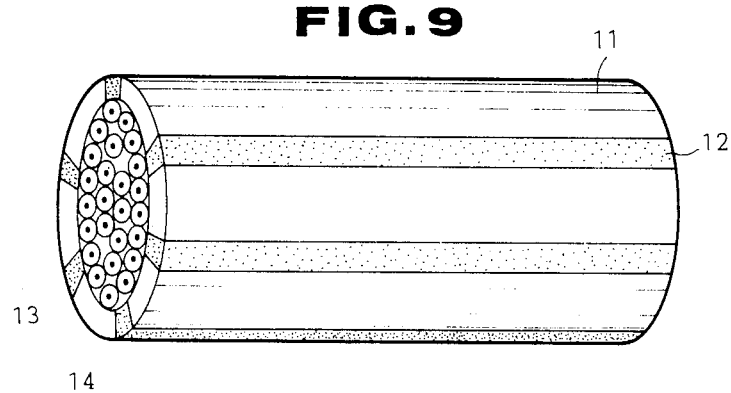
Figure 10:
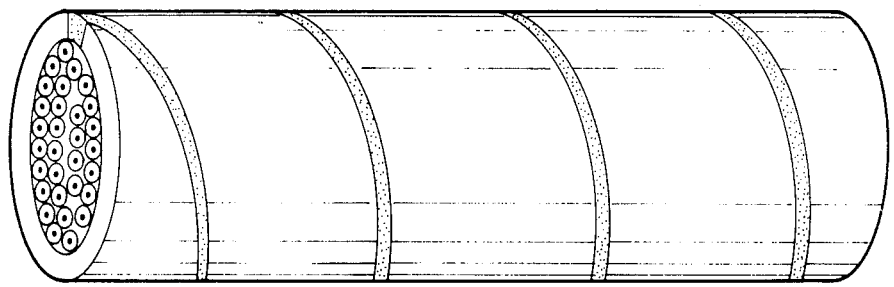

As described above, the composite tube comprises the non-Ag metal portion 11 and the Ag portion 12. The Ag portion 12 may have an oval-shape as shown in FIG. 6, a rectangular-shape as shown in FIG. 7, a circular-shape as shown in FIG. 8, a paralleled belt-shape as shown in FIG. 9, and a spiral-shape as shown in FIG. 10, and the shape thereof is not restricted to the above listed ones.

Furthermore, the superconducting composite cable as illustrated in FIGS. 6 through 10 has a circular cross section. However, the shape of the cross section is not restricted to circular, and may be a polygonal such as square, rectangular, hexagonal, or oval or any desired shape.

The above described metal sheath, concretely, the composite pipe in the superconducting composite wire, or the composite tube in the superconducting composite cable of this invention, can be produced by inserting a pipe of Ag or the like into a tube or a pipe each having a plurality of windows (perforations or the like) according to a conventional clad method or a method similar thereto and unifying them by drawing.

EXAMPLES

Next, the present invention will be concretely explained with reference to the following examples.

EXAMPLE 1

As starting powder, $Y_2O_3$ powder, $BaCO_3$ powder and CuO powder each having an average grain size of 6 $\mu$m are provided and blended in a blend ratio: $Y_2O_3$:15.13%, $BaCO_3$:52.89%, CuO:31.98% (% by weight). The blended powder are calcined in the air, at a temperature of 910° C., for a retention time of 10 hours, and then ground to obtain powder having an average grain size of 2.5 $\mu$m. Thus, a superconducting ceramics powder is produced which has a composition of $YBa_2Cu_3O_7$ and has a perovskite structure.

Figure 11:
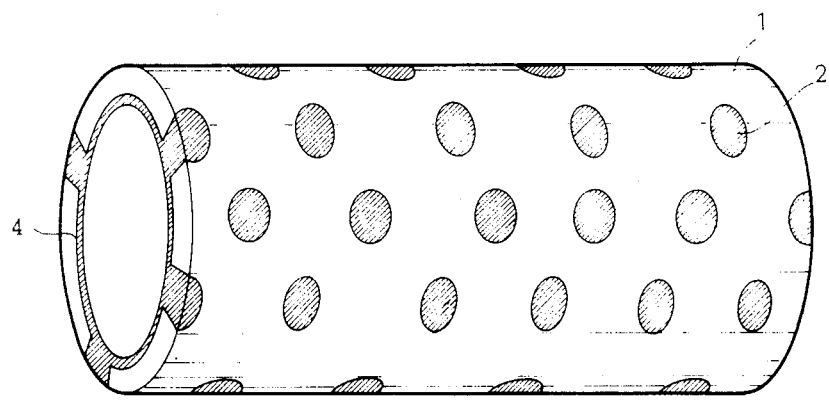
FIG. 11 shows a schematical perspective view, with portions broken away for clarity, of a composite pipe which is used as a superconducting composite wire of Example 1.

On the other hand, a composite pipe as illustrated in FIG. 11 is provided. The composite pipe comprises an inner layer 4 made of Ag and an outer layer including an Ag portion 2 and Austenite based stainless steel 1 made of SUS304. The inner layer 4 has dimensions of thickness: 0.5 mm × inner diameter: 5.0 mm, and the outer layer has dimensions of thickness: 0.5 mm × outer diameter: 7.0 mm. The Ag portion 2 of the outer layer has a ring-shaped and has diameter of 1.8 mm.

The above-described composite pipe is filled with the superconducting ceramics powder 3, and then both ends thereof are sealed under vacuum. The sealed composite pipe is subjected to rotary-swaging to obtain a wire having a diameter of 3.0 mm, and then the wire is subjected to rolling with grooved rolls to obtain a superconducting composite wire having a diameter of 2.0 mm. The superconducting composite wire has dimensions of thickness of inner layer thereof: 0.2 mm and thickness of outer layer thereof: 0.2 mm. On the surface of the superconducting composite wire, the oval-shaped Ag portions are exposed.

The thus-obtained superconducting composite wire is subjected to heat-treatment in an oxygenic atmosphere, at temperature of 920° C., for a retention time of 15 hours. As a result, the superconducting composite wire does not cause the troubles encountered in the conventional superconducting composite wire covered with Ag sheath. Specifically, the superconducting composite wire according to this invention is hardly bent during the heat-treatment, and is hardly broken down. Further, the wire is able to be easily handled.

The characteristics of the superconducting composite wire are measured and the results of the critical temperature (Tc): 91° K. and critical current value (Jc): 3200 $A/cm^2$ are obtained.

For comparison, the superconducting wire covered with Ag sheath having the same dimensions as the superconducting composite wire according to the present invention is provided, and the characteristics of the superconducting composite wire is measured and the results of the critical temperature (Tc): 91° K. and critical current value (Jc): 3250 $A/cm^2$ are obtained.

EXAMPLE 2

As starting powder, $Y_2O_3$ powder, $BaCO_3$ powder and CuO powder each having an average grain size of 6 $\mu$m are provided and blended in a blend ratio: $Y_2O_3$:15.13%, $BaCO_3$:52.89%, CuO:31.98% (% by weight). The blended powder is calcined in the air, at a temperature of 910° C., for a retention time of 10 hours, and then ground to obtain powder having an average grain size of 2.5 $\mu$m. Thus, a superconducting ceramics powder is produced which has a composition of $YBa_2Cu_3O_7$ and has a perovskite structure.

A case of Ag having dimensions of inner diameter: 5 mm × thickness: 1 mm × length: 200 mm is filled with the superconducting ceramics powder thus obtained, and both ends thereof are sealed under vacuum. Subsequently, the Ag case is subjected to cold rotary-swaging and cold rolling with grooved rolls. Finally, the Ag case is subjected to rolling with grooved rolls to obtain forty superconducting wires each having dimensions of diameter: 2.0 mm × length: 1700 mm.

On the other hand, a composite tube including Ag portions and SUS304 Austenite based stainless steel portions and having dimensions of inner diameter: 10 mm×thickness: 1.5 mm×length: 1000 mm is provided. The composite tube is filled with twenty of the above described superconducting wires, and then is subjected to processing with a die to obtain a superconducting composite cable having a diameter of 7 mm. Next, the superconducting composite cable is subjected to heat-treatment in an oxygenic atmosphere, at temperature of 920° C., and for a retention time of 15 hours. The characteristics of the superconducting composite cable thus-obtained is measured and the results of the critical temperature (Tc): 92° K. and critical current value (Jc): 4300 A/cm$^2$ are obtained.

On the other hand, for comparison, a tube made of pure Ag having dimensions of inner diameter: 10 mm×thickness: 1.5 mm×length: 1000 mm is filled with the rest twenty superconducting wires, and then is subjected to rolling with a die to obtain a superconducting cable having a diameter of 7 mm. The thus-obtained superconducting cable is subjected to the same heat-treatment as that of the above-described superconducting composite cable, and the characteristics of the superconducting cable are measured. The results of the critical temperature (Tc): 92° K. and critical current value (Jc): 4310 A/cm$^2$ are obtained.

INDUSTRIAL APPLICABILITY

Making a comparison between the superconducting composite wire and cable according to this invention and the conventional superconducting wire and cable, there is no difference therebetween as to the superconductive characteristics. However, in the superconducting composite wire and cable, the content of Ag, which is very expensive, can be reduced in comparison with the conventional wire and cable of this invention. Also, materials used have excellent strength at high temperatures. Accordingly, the superconducting composite wire and cable cause no trouble such as the breaking of the wire and cable, which would conventionally occur in the final heat-treatment step, so that they can be produced with high productivity. Furthermore, because they have excellent strength at room temperature, they can be handled without special care, and can be serviced and examined at ease even after installment.

We claim:

1. A superconducting structural body comprising
a superconducting ceramics and
a metal sheath surrounding the superconducting ceramics,
the metal sheath including
an Ag portion and
a non-Ag metal portion, the Ag portion existing from inner to outer faces of the metal sheath, and the superconducting ceramics portion existing in the structural body and the non-Ag metal portion used as a structural material for the metal sheath as the outermost indirectly contacting each other through the Ag material.

2. A superconducting composite wire comprising
a composite pipe having an inner layer made of Ag material and an outer layer including
an Ag portion and
a non-Ag metal portion, the Ag portion of the outer layer being solid with the Ag material of the inner layer and exposed on the outer surface of the composite pipe, and
superconducting ceramics filled in the composite pipe.

3. A superconducting composite cable comprising
a plurality of superconducting wires covered with an Ag material and filled with superconducting ceramics, and
a composite tube including
an Ag portion, and
a non-Ag metal portion, the Ag portion existing from inner to outer faces of the composite tube, the superconducting wires being covered with the composite tube.

4. A process for fabricating superconducting composite wire comprising steps of:
filling a composite tube with a superconducting ceramics, the composite tube having an inner layer made of Ag material and an outer layer including
an Ag portion and
a non-Ag metal portion, the Ag portion of the outer layer being solid with the Ag material of the inner layer and exposed on the outer surface of the composite tube,
sealing the both ends of the composite tube under vacuum,
drawing the sealed composite tube, and
subjecting the thus drawn tube drawn to heat-treatment.

* * * * *

UNITED STATES PATENT AND TRADEMARK OFFICE
CERTIFICATE OF CORRECTION

PATENT NO. : 4,983,576
DATED : January 8, 1991
INVENTOR(S) : Hagino, et al

It is certified that error appears in the above-identified patent and that said Letters Patent is hereby corrected as shown below:

On the title page, item [54], lines 1-3, and col. 1, lines 1-2, the title should reas as follows:

--SUPERCONDUCTING COMPOSITE WIRE AND CABLE, AND PROCESSES
FOR FABRICATING THEM--.

Signed and Sealed this

Sixth Day of October, 1992

Attest:

DOUGLAS B. COMER

Attesting Officer

Acting Commissioner of Patents and Trademarks